(12) United States Patent
Chuang et al.

(10) Patent No.: US 11,293,973 B2
(45) Date of Patent: Apr. 5, 2022

(54) OPTICAL TEST EQUIPMENT WITH HEATING FUNCTION

(71) Applicant: MPI CORPORATION, Chu-Pei (TW)

(72) Inventors: Wen Pin Chuang, Chu-Pei (TW); Yi Ching Lo, Chu-Pei (TW)

(73) Assignee: MPI CORPORATION, Hsinchu Shien (TW)

( * ) Notice: Subject to any disclaimer, the term of this patent is extended or adjusted under 35 U.S.C. 154(b) by 0 days.

(21) Appl. No.: 16/950,324

(22) Filed: Nov. 17, 2020

(65) Prior Publication Data

US 2021/0156907 A1 May 27, 2021

Related U.S. Application Data

(60) Provisional application No. 62/940,289, filed on Nov. 26, 2019.

(30) Foreign Application Priority Data

Oct. 20, 2020 (TW) .................................. 109136294

(51) Int. Cl.
*G01R 31/28* (2006.01)
*G01R 31/26* (2020.01)

(52) U.S. Cl.
CPC ..... *G01R 31/2875* (2013.01); *G01R 31/2635* (2013.01); *G01R 31/2865* (2013.01)

(58) Field of Classification Search
CPC ....... G01N 2201/062; G01N 33/54366; G01N 2201/0612; G01N 21/6454; G01N 2035/00158; G01N 2021/6421; G01N 2201/0627; G01N 23/223; G01N 23/2251; G01N 2021/556; G01N 30/74; G01N 2291/02881; G01N 23/227; G01N 25/72; G01R 19/165; G01R 31/2635; G01R 31/275; G01R 31/2865; G01R 31/2872; G01R 31/2874; G01R 31/2875; G01R 31/2884; G01R 31/2891; G01R 31/2831;
(Continued)

(56) References Cited

U.S. PATENT DOCUMENTS

| 5,493,236 A * | 2/1996 | Ishii ................... G01R 31/2656 324/501 |
| 6,515,494 B1 * | 2/2003 | Low ................... G01N 21/9501 324/501 |

(Continued)

*Primary Examiner* — Vinh P Nguyen
(74) *Attorney, Agent, or Firm* — Birch, Stewart, Kolasch & Birch, LLP

(57) ABSTRACT

An optical test equipment includes a chuck, a light receiving device corresponding in position to an opening of the chuck, a transparent heating plate disposed on the chuck or light receiving device in a way that the bottom surface of the transparent heating plate faces toward the light receiving device for a wafer to be disposed on the top surface of the transparent heating plate, allowing light to pass through the top and bottom surfaces and being powered to generate heat to heat the wafer, and a probing device including a seat and a probe protruding from the seat toward the top surface of the transparent heating plate for probing a light emitting chip of the wafer. The equipment can perform light emitting efficiency test to the light emitting chip on the wafer before dicing and heat the light emitting chip at the same time.

11 Claims, 2 Drawing Sheets

(58) Field of Classification Search
CPC ...... G01R 31/2863; H01L 2924/12044; H01L 25/167; H01L 2924/12041
See application file for complete search history.

(56) References Cited

U.S. PATENT DOCUMENTS

| | | | |
|---|---|---|---|
| 7,071,713 B2* | 7/2006 | Furukawa | G01R 31/307 |
| | | | 250/492.2 |
| 9,797,942 B2* | 10/2017 | Engberg | G01J 5/522 |
| 10,801,969 B1* | 10/2020 | Yuen | G01N 21/01 |
| 2021/0239750 A1* | 8/2021 | Yuen | G01R 31/2601 |

* cited by examiner

OPTICAL TEST EQUIPMENT WITH HEATING FUNCTION

CROSS REFERENCE TO RELATED APPLICATIONS

This non-provisional application claims the benefit under 35 U.S.C. § 119(e) to U.S. Provisional Application No. 62/940,289, filed on Nov. 26, 2019, and under 35 U.S.C. § 119(a) to patent application No. 109136294, filed in Taiwan on Oct. 20, 2020, all of which are hereby expressly incorporated by reference into the present application.

BACKGROUND OF THE INVENTION

1. Field of the Invention

The present invention relates generally to optical test equipment for testing light emitting chips and more particularly, to an optical test equipment with a heating function.

2. Description of the Related Art

During light emitting efficiency test of light emitting chips, such as light emitting diode chips, laser chips and so on, it usually makes a chip under test emit light in a way that conductive contacts of the chip under test are probed by probes of a probe card, and at the same time a light receiving device, e.g. an integrating sphere, receives the light emitted by the chip under test for measuring the light emitting efficiency thereof. Such testing process may be performed to a large number of chips connected with each other in a manufactured wafer, that is to say, the manufactured wafer has not been diced into a large number of separated chips. For a light emitting chip provided on two opposite surfaces thereof with conductive contacts and light emitting portions respectively, e.g. a flip-chip type light emitting chip, the aforementioned light emitting efficiency test is usually performed in a way that the conductive contacts of the light emitting chip face up and the light emitting portions face down. In other words, the probes are located above the top surface of the wafer and moves downwardly to probe the conductive contacts of the chip and the light receiving device is located below the bottom surface of the wafer to receive the light emitted downwardly from the light emitting portions of the chip.

Although a probing apparatus is currently available for optical test of light emitting chips on a wafer before dicing, the chips under test cannot be heated during the test, so that the light emitting efficiency test cannot be performed to the chips under test at a specific high temperature.

SUMMARY OF THE INVENTION

The present invention has been accomplished in view of the above-noted circumstances. It is an objective of the present invention to provide an optical test equipment with a heating function, which is able to perform light emitting efficiency test to the light emitting chip on a wafer before dicing and to heat the light emitting chip at the same time.

To attain the above objective, the present invention provides an optical test equipment with a heating function, which includes a chuck having an opening, a light receiving device corresponding in position to the opening of the chuck, a transparent heating plate, and a probing device. The transparent heating plate has a top surface for supporting a wafer, and a bottom surface. The transparent heating plate is disposed on one of the chuck and the light receiving device in a way that the bottom surface of the transparent heating plate faces toward the light receiving device. The transparent heating plate is adapted for allowing light to pass through the top surface and the bottom surface thereof and capable of being powered to generate heat to heat the wafer. The probing device includes a seat, and a probe protruding from the seat toward the top surface of the transparent heating plate for probing a light emitting chip of the wafer.

As a result, for the light emitting chip such as the flip-chip type chip, the face-up conductive contact thereof is probed by the probe and the light emitting chip emits light downwardly when being probed by the probe, so the emitted light can pass through the transparent heating plate, e.g. electrically conductive glass, and be received by the light receiving device, e.g. integrating sphere, disposed below the transparent heating plate to measure the light emitting efficiency thereof. At the same time, the transparent heating plate can heat the wafer including the light emitting chip under test and located on the top surface of the transparent heating plate.

Preferably, the optical test equipment may further include a temperature sensing unit and a temperature control unit. The temperature sensing unit is adapted for sensing the temperature of at least one of the transparent heating plate and the wafer. According to the temperature sensed by the temperature sensing unit, the temperature control unit performs a feedback control to a power source for supplying power to the transparent heating plate. More preferably, the optical test equipment may further include an auxiliary heater adapted for heating the wafer and electrically connected with the temperature control unit. The temperature control unit performs a feedback control to the auxiliary heater according to the temperature sensed by the temperature sensing unit. In this way, the optical test equipment can perform the light emitting efficiency test to the light emitting chip under specific high temperature conditions. For example, a temperature that may be reached because of the heat generated from the light emitting chip in practical use can be simulated so as to detect whether the light emitting efficiency of the light emitting chip may be decreased when the temperature of the light emitting chip rises due to the heat generated therefrom.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
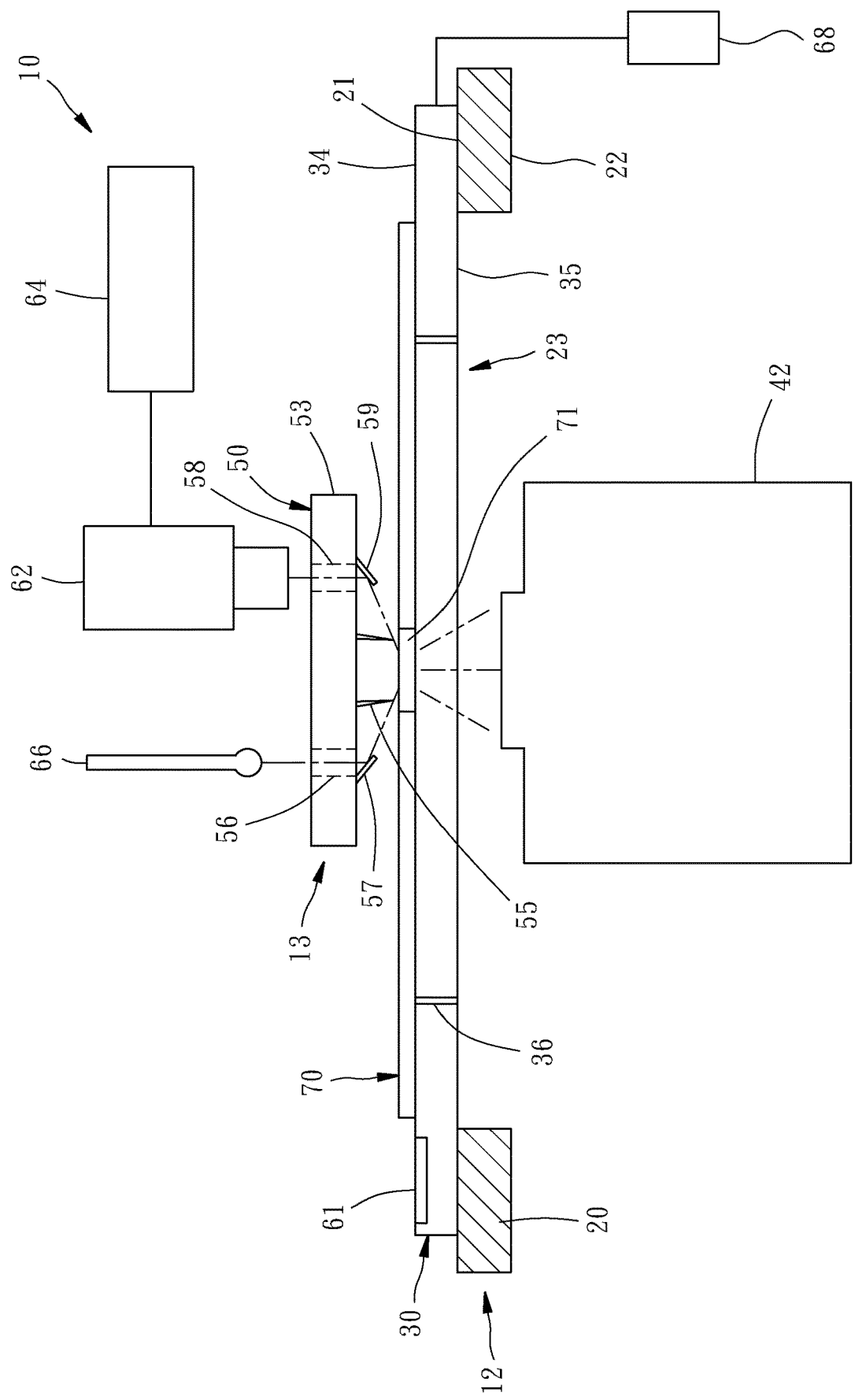
FIG. 1 is a schematic sectional view of a wafer and an optical test equipment with a heating function according to a first preferred embodiment of the present invention.

First of all, it is to be mentioned that in the following embodiments and claims, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements. Besides, for the convenience of illustration, the components and the structure shown in the figures of the present invention are not drawn according to the real scale and amount. In the following embodiments and the accompanying drawings, same or similar reference numerals designate same or similar elements or the structural features thereof.

Referring to FIG. 1, an optical test equipment 10 with a heating function according to a first preferred embodiment of the present invention includes a chuck 20, a transparent heating plate 30, a light receiving device 42, a probing device 50, a temperature sensing unit including a first temperature sensor 61 and a second temperature sensor 62, a temperature control unit electrically connected with the temperature sensing unit and including a temperature control device 64, and a power source 68 electrically connected with the transparent heating plate 30 and the temperature control unit.

Figure 2:
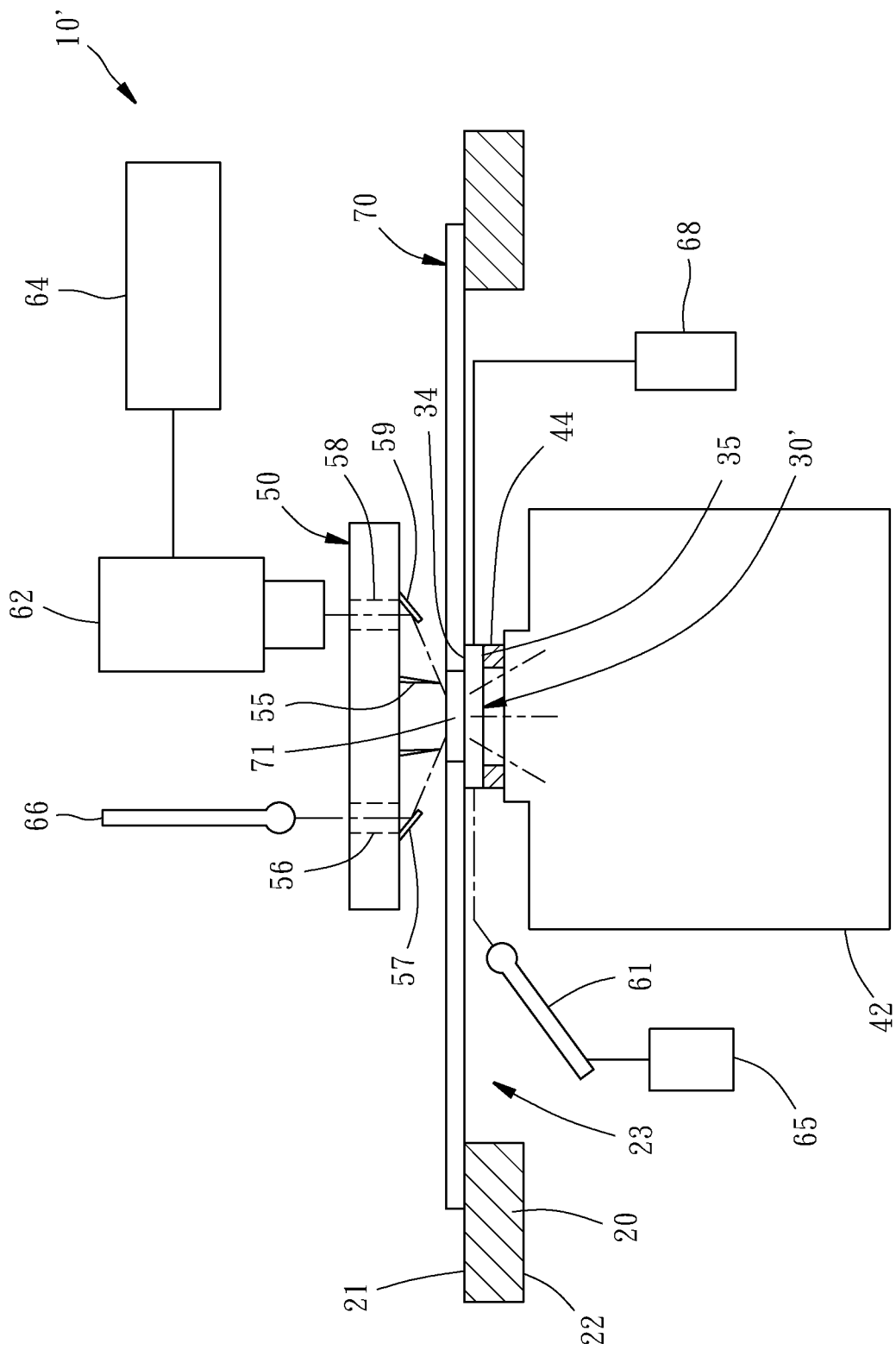
FIG. 2 is a schematic sectional view of a wafer and an optical test equipment with a heating function according to a second preferred embodiment of the present invention.

The optical test equipment 10 is adapted to perform light emitting efficiency test to a plurality of light emitting chips 71 included in a wafer 70, such as vertical-cavity surface-emitting laser array chips (hereinafter referred to as VCSEL chips). The wafer 70 is a non-diced wafer and contains thousands or more tiny light emitting chips 71 connected with each other. In other words, the optical test equipment 10 is adapted for testing the light emitting chips 71 on a wafer before dicing. FIG. 1 and FIG. 2 are schematic sectional views of the optical test equipment of the present invention and the wafer 70. For the simplification of the figures and the convenience of illustration, FIG. 1 and FIG. 2 only schematically show one of the light emitting chips 71, which is represented by a section of the wafer 70.

The optical test equipment 10 of the present invention may, but unlimited to, include a triaxial drive structure (not shown), and a horizontally movable structure 12 and a vertically movable structure 13, which are driven by the triaxial drive structure to displace. Specifically speaking, the triaxial drive structure includes a base unit (not shown), and two horizontally driving devices (not shown) and a vertically driving device (not shown), which are disposed on the base unit. The horizontally movable structure 12 is disposed on the triaxial drive structure in a way that the horizontally movable structure 12 can be driven by the two horizontally driving devices to move along two horizontal axes. The vertically movable structure 13 is disposed on the triaxial drive structure in a way that the vertically movable structure 13 can be driven by the vertically driving device to move along a vertical axis and the vertically movable structure 13 is located above the horizontally movable structure 12. The aforementioned horizontally and vertically driving devices are well-known by a person skill in the art and structurally the same with the conventional linearly driving device, thereby not detailedly described hereinafter.

The aforementioned horizontally movable structure 12 includes a base (not shown) driven by the aforementioned horizontally driving devices to move along the horizontal axes, the aforementioned chuck 20 (also called wafer chuck) disposed on the base in a way that the chuck 20 can be driven by a first rotary driving device (not shown) to rotate, and the aforementioned transparent heating plate 30 disposed on the chuck 20. The wafer 70 is placed on the transparent heating plate 30. The aforementioned vertically movable structure 13 includes a base (not shown) driven by the aforementioned vertically driving device to move along the vertical axis, and the aforementioned probing device 50 disposed on the base in a way that the probing device 50 can be driven by a second rotary driving device (not shown) to rotate. The aforementioned rotary driving devices are well-known by a person skill in the art and structurally the same with the conventional rotary driving device, thereby not detailedly described hereinafter.

It can be known from the above description that the chuck 20, transparent heating plate 30 and wafer 70 in this embodiment can be driven together by the aforementioned horizontally driving devices and first rotary driving device to horizontally displace along the horizontal axes and rotate about the vertical axis, and the probing device 50 in this embodiment can be driven by the aforementioned vertically driving device and second rotary driving device to vertically displace along the vertical axis and rotate about the vertical axis. However, the arrangements of the chuck 20, transparent heating plate 30, and probing device 50 in the present invention are unlimited to those described in this embodiment, as long as the probing device 50 is able to move relative to the chuck 20 and transparent heating plate 30 hence to move toward and away from the wafer 70.

The chuck 20 has a top surface 21, a bottom surface 22, and an opening 23 penetrating through the top surface 21 and the bottom surface 22. The transparent heating plate 30 is an electrically conductive transparent plate for allowing light to pass through the top and bottom surfaces 34 and 35 of the transparent heating plate 30. For example, the transparent heating plate 30 may be an electrically conductive glass plated with an electrically conductive layer. For example, the electrically conductive layer may be made from indium tin oxide (hereinafter referred to as "ITO"). The transparent heating plate 30 is disposed on the top surface 21 of the chuck 20 in a way that the bottom surface 35 faces toward the opening 23 for the wafer 70 to be disposed on the top surface 34. In this way, even though the wafer 70 is a thin wafer, it can still be supported by the transparent heating plate 30 to avoid bending. Besides, the transparent heating plate 30 further has a plurality of vacuum holes 36 for communicating with a vacuum source (not shown), so that the wafer 70 can be attached thereon by vacuum suction, which makes the wafer 70 disposed on the top surface 34 of the transparent heating plate 30 relatively more stably. The light emitting chips 71 included in the wafer 70 may be flip-chip type chips, such as VCSEL chips, laser chips and so on, which have conductive contacts (not shown) facing up for being probed by the probing device 50, which will be described in detail below. The light emitting chips 71 emit light downwardly when being probed by the probing device 50 and the emitted light can pass through the transparent heating plate 30, so that the light receiving device 42, e.g. integrating sphere, facing toward the bottom surface 35 of the transparent heating plate 30 through the opening 23 of the chuck 20 can receive the light emitted from the light emitting chips 71 to measure the light emitting efficiency thereof. In addition, the transparent heating plate 30 is electrically connected with the power source 68, thereby capable of being powered to generate heat to heat the wafer

70. In other words, the transparent heating plate 30 in this embodiment can support the wafer 70, suck the wafer 70, heat the wafer 70, and allow the light emitted from the chip 71 to pass therethrough.

The probing device 50 may be a conventional probe card, which includes a seat 53 and at least one probe 55 protruding from the seat 53 toward the top surface 34 of the transparent heating plate 30 for probing the conductive contact (not shown) of the light emitting chip 71. In this way, the light emitting chip 71 can emit light by receiving a test signal, which is outputted from a tester (not shown) located above the probing device 50, through the probing device 50, and the emitted light is received by the light receiving device 42 for being further tested. It can be known from the above description that the optical test equipment of the present invention is able to perform light emitting efficiency test to the light emitting chip 71 on the wafer 70 before dicing and to heat the light emitting chip 71 at the same time.

In the aforementioned process of testing the light emitting chip 71, the first temperature sensor 61 disposed on the transparent heating plate 30 is adapted to sense the temperature of the transparent heating plate 30 and transmit the sensed signal to the temperature control device 64, for the temperature control device 64 to perform a feedback control to the power source 68 according to the temperature sensed by the first temperature sensor 61, thereby controlling the power of the transparent heating plate 30 for heating the light emitting chip 71 to provide the demanded environmental temperature for the test of the light emitting chip 71.

The optical test equipment of the present invention may, but unlimited to, further include an auxiliary heater 66 electrically connected with the temperature control device 64. The auxiliary heater 66 may, but unlimited to, be a laser heater for emitting laser light to heat the wafer 70 in a non-contact manner through a through hole 56 of the probing device 50. The probing device 50 may be even provided with a reflector 57 located at the bottom end of the through hole 56 to reflect the aforementioned laser light to the light emitting chip 71 under test, so that the light emitting chip 71 under test is directly heated. Besides, the second temperature sensor 62 is a non-contact thermometer for sensing the temperature of the wafer 70 in a non-contact manner through another through hole 58 of the probing device 50. The probing device 50 may be even provided with another reflector 59 located at the bottom end of the through hole 58, so that the reflecting effect of the reflector 59 enables the second temperature sensor 62 to sense the temperature of the light emitting chip 71 under test. In this way, the temperature control device 64 is able to perform a feedback control to the auxiliary heater 66 according to the temperature sensed by the second temperature sensor 62 for appropriately compensating the temperature of the wafer 70 or light emitting chip 71 by the auxiliary heater 66, such that the temperature of the wafer 70 or the light emitting chip 71 can be controlled more accurately.

By the cooperation of the auxiliary heater 66 and/or the transparent heating plate 30 with the temperature sensing unit and the temperature control unit, the temperature of the wafer 70 or light emitting chip 71 can be controlled at a specific temperature, so the optical test equipment 10 of the present invention can test the light emitting efficiency of the light emitting chip 71 of the wafer 70 under the specific temperature. For example, the micro laser chip is liable to generate heat to rise the temperature thereof when emitting light. The optical test equipment 10 of the present invention can simulate the temperature of the micro laser chip generating heat when in use to test the micro laser chip under such temperature condition, so as to eliminate the chip with decrease light emitting efficiency under such temperature condition, thereby ensuring the practical efficiency of the micro laser chips passed in the testing. Further speaking, in the present invention, the wafer 70 is heated by the transparent heating plate 30, the temperature on the surface of the wafer 70 is sensed or the temperature of the light emitting chip 71 under test is even sensed directly, and the temperature is compensated by the auxiliary heater 66, such that the test consumes relatively less time and the temperature is controlled more effectively hence to reduce the error between the actual temperature and the predetermined temperature. Besides, the light emitting chips 71 on the wafer 70 are highly uniform in test conditions thereof, such as temperature and probed magnitude, so that the received light and electrical properties can be determined accurately.

It is to be mentioned that in this embodiment, the temperature control unit receives the sensed signals of the first and second temperature sensors 61 and 62 and performs the feedback controls to the power source 68 and the auxiliary heater 66 by the same temperature control device 64. However, the temperature control unit may include two temperature control devices for receiving the sensed signals of the first and second temperature sensors 61 and 62 respectively and performing the feedback controls to the power source 68 and the auxiliary heater 66 respectively. Besides, the temperature control unit is unlimited to perform the feedback controls to the power source 68 and the auxiliary heater 66 according to the temperature of the transparent heating plate 30 and the temperature of the wafer 70 respectively, as long as the demanded temperature for the test of the light emitting chip 71 under test can be reached effectively.

Referring to FIG. 2, an optical test equipment 10' according to a second preferred embodiment of the present invention is similar in structure to the above-described optical test equipment 10, but they are primarily different in the size and arranged manner of the transparent heating plate. Specifically speaking, the transparent heating plate 30 of the optical test equipment 10 as shown in FIG. 1 has an area larger than the area of the wafer 70, and the transparent heating plate 30 is disposed on the top surface 21 of the chuck 20 for the whole wafer 70 to be disposed on the top surface 34 of the transparent heating plate 30 for heating the whole wafer 70. However, the area of the transparent heating plate 30' of the optical test equipment 10' as shown in FIG. 2 is much smaller than the area of the wafer 70, and the transparent heating plate 30' is disposed on the light receiving device 42 through a support frame 44 and located in the opening 23 of the chuck 20, such that the wafer 70 is supported by the top surface 21 of the chuck 20 and the top surface 34 of the transparent heating plate 30' at the same time. As such, the wafer 70 is supported appropriately and thereby prevented from bending deformation when being probed. By the horizontal displacement of the wafer 70 driven by the chuck 20, the transparent heating plate 30' can support the wafer 70 at any position thereof, which means in every time of test, the transparent heating plate 30' can support the light emitting chip 71 under test and heat the light emitting chip 71 under test at the same time. Besides, in the optical test equipment 10' as shown in FIG. 2, the first temperature sensor 61 is adapted to sense the temperature of the transparent heating plate 30' in a non-contact manner through the opening 23 of the chuck 20. In addition, the temperature control unit of the optical test equipment 10' as shown in FIG. 2 includes two temperature control devices 64 and 65. The two temperature control devices 64 and 65 are adapted to receive the sensed signals of the second and first temperature sensors 62 and 61 respectively, and perform feedback controls to the auxiliary heater 66 and the power source 68 for applying power to the transparent heating plate 30' respectively. Such optical test equipment 10' can also attain the aforementioned effects of the optical test equipment 10. Further speaking, the advantage of the embodiment as shown in FIG. 2 is that the transparent heating plate 30' can be added to the light receiving device 42 of the existing machine to heat a specific area of the wafer for the test. The transparent heating plate 30' can also be provided with vacuum holes to fix the part of the wafer surrounding the light emitting chip 71 under test by vacuum suction. In this way, the probed area is directly supported, quickly heated and thermally compensated, and such arrangement has high flexibility because the transparent heating plate 30' can be directly added to the existing machine without being limited by the size of chuck 20, and benefits to the switching of the light emitting chip 71 under test.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical test equipment, comprising:
a chuck having an opening;
a light receiving device corresponding in position to the opening of the chuck;
a transparent heating plate having a top surface for supporting a wafer and a bottom surface, the transparent heating plate being disposed on one of the chuck and the light receiving device in a way that the bottom surface of the transparent heating plate faces toward the light receiving device, the transparent heating plate allowing light to pass through the top surface and the bottom surface thereof and being powered to generate heat to heat the wafer;
a probing device comprising a seat and a probe protruding from the seat toward the top surface of the transparent heating plate for probing a light emitting chip of the wafer;
a power source electrically connected with the transparent heating plate,
a temperature sensing unit for sensing at least one of a temperature of the transparent heating plate and a temperature of the wafer; and
a temperature control unit electrically connected with the power source and the temperature sensing unit, wherein the temperature control unit performs a feedback control to the power source according to the temperature sensed by the temperature sensing unit.

2. The optical test equipment as claimed in claim 1, wherein the transparent heating plate is an electrically conductive glass.

3. The optical test equipment as claimed in claim 1, further comprising an auxiliary heater for heating the wafer; the auxiliary heater is electrically connected with the temperature control unit; the temperature control unit performs a feedback control to the auxiliary heater according to the temperature sensed by the temperature sensing unit.

4. The optical test equipment as claimed in claim 3, wherein the probing device has a through hole, through which the auxiliary heater heats the wafer in a non-contact manner.

5. The optical test equipment as claimed in claim 4, wherein the auxiliary heater heats the light emitting chip under test through a reflector.

6. The optical test equipment as claimed in claim 3, wherein the auxiliary heater emits laser light to heat the wafer in a non-contact manner.

7. The optical test equipment as claimed in claim 3, wherein the temperature sensing unit comprises a first temperature sensor for sensing the temperature of the transparent heating plate, and a second temperature sensor for sensing the temperature of the wafer; the temperature control unit performs the feedback control to the power source according to the temperature sensed by the first temperature sensor, and performs the feedback control to the auxiliary heater according to the temperature sensed by the second temperature sensor.

8. The optical test equipment as claimed in claim 1, wherein the temperature sensing unit comprises a temperature sensor for sensing the temperature of the wafer in a non-contact manner through a through hole of the probing device.

9. The optical test equipment as claimed in claim 8, wherein the temperature sensor senses the temperature of the light emitting chip under test through a reflector.

10. The optical test equipment as claimed in claim 1, wherein the transparent heating plate is disposed on the chuck in a way that the bottom surface of the transparent heating plate faces toward the opening, and the transparent heating plate has a plurality of vacuum holes for vacuum suction of the wafer.

11. The optical test equipment as claimed in claim 1, wherein the transparent heating plate is disposed on the light receiving device and located in the opening of the chuck in a way that the wafer is be supported by the chuck and the transparent heating plate.

\* \* \* \* \*